United States Patent [19]

Fujieda et al.

[11] Patent Number: 5,170,398
[45] Date of Patent: Dec. 8, 1992

[54] PATTERN GENERATING APPARATUS FOR MEMORY HAVING A LOGICAL OPERATION FUNCTION

[75] Inventors: Takamori Fujieda; Tadatoshi Miyagawa, both of Tokyo, Japan

[73] Assignee: Ando Electric Co., Ltd., Tokyo, Japan

[21] Appl. No.: 554,316

[22] Filed: Jul. 18, 1990

[30] Foreign Application Priority Data

Jul. 21, 1989 [JP] Japan .................... 1-189846

[51] Int. Cl.$^5$ .......................................... G01R 31/28
[52] U.S. Cl. ............................................ 371/27; 371/24
[58] Field of Search .................... 371/27, 24, 21.2; 364/266.4, 943.9

[56] References Cited

U.S. PATENT DOCUMENTS

| | | | |
|---|---|---|---|
| 4,775,977 | 10/1988 | Dehara | 371/27 |
| 4,862,460 | 8/1989 | Yamaguchi | 371/27 |
| 5,043,988 | 8/1991 | Brglez et al. | 371/27 |

Primary Examiner—Vincent P. Canney
Attorney, Agent, or Firm—Seidel, Gonda, Lavorgna & Monaco

[57] ABSTRACT

The present invention relates to a test pattern generating apparatus for a memory having a logical operation function. A principal object is to achieve a high speed data writing into an expected value memory and to make it possible to generate a complicated expected data. The apparatus comprises a pattern generator for generating address, data, ALU control and a write control; a tester CPU for generating a data bus and an address bus; an address selector which receives said address and the address bus; a data selector which receives said data and the data bus; an expected value memory which receives an output of the data selector, an output of said address selector and the write control from said pattern generator; an ALU(arithmetic logic unit) which receives the data from the pattern generator and an output of the expected value memory and performs a logical operation under the control of the ALU control, the output being supplied as a write data to the memory unit to be tested; and a comparator which receives an output of the memory unit and compares the output of the memory unit with an expected data from said ALU, the memory unit beign supplied with the address from the pattern generator and a write data from the ALU.

1 Claim, 5 Drawing Sheets

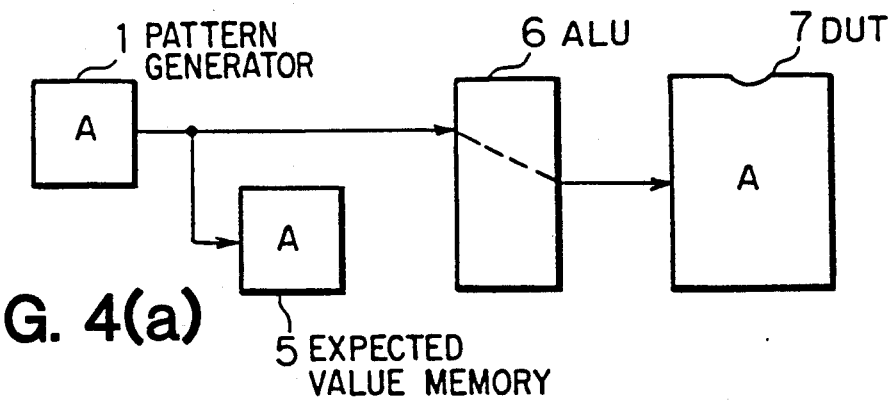
F I G. 4(a)
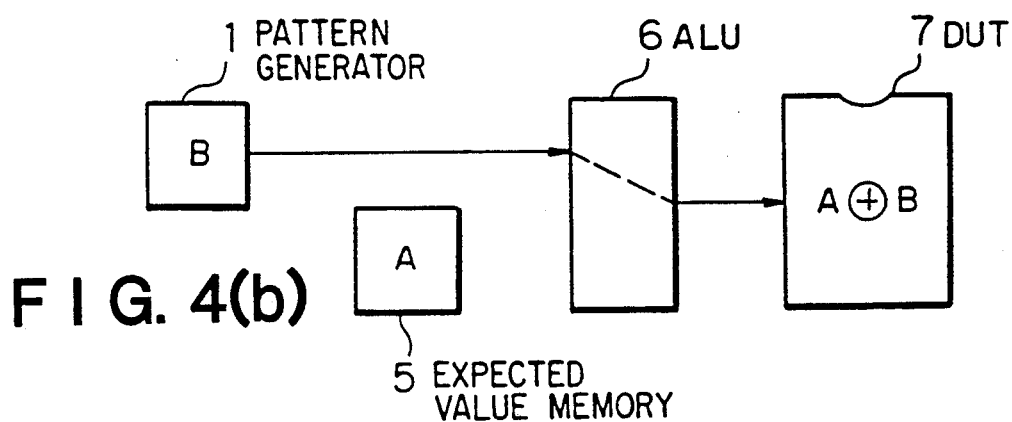
F I G. 4(b)
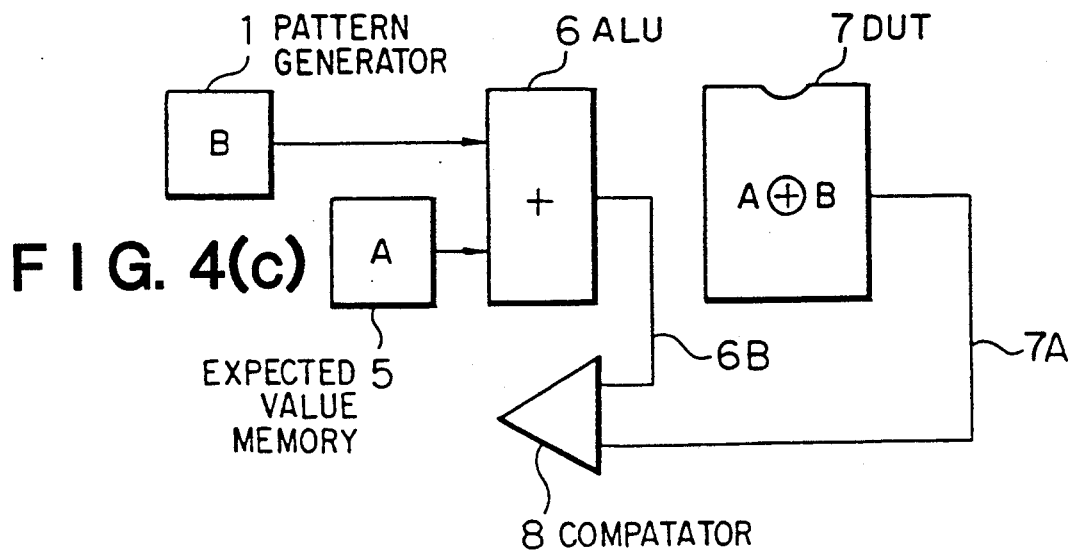
F I G. 4(c)

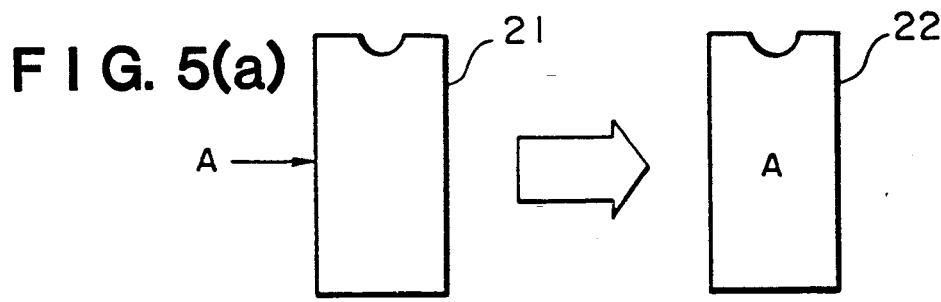
FIG. 5(a)
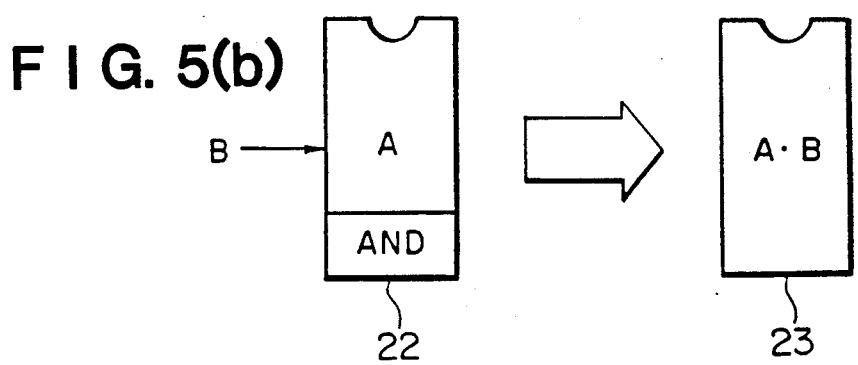
FIG. 5(b)
FIG. 6
PRIOR ART
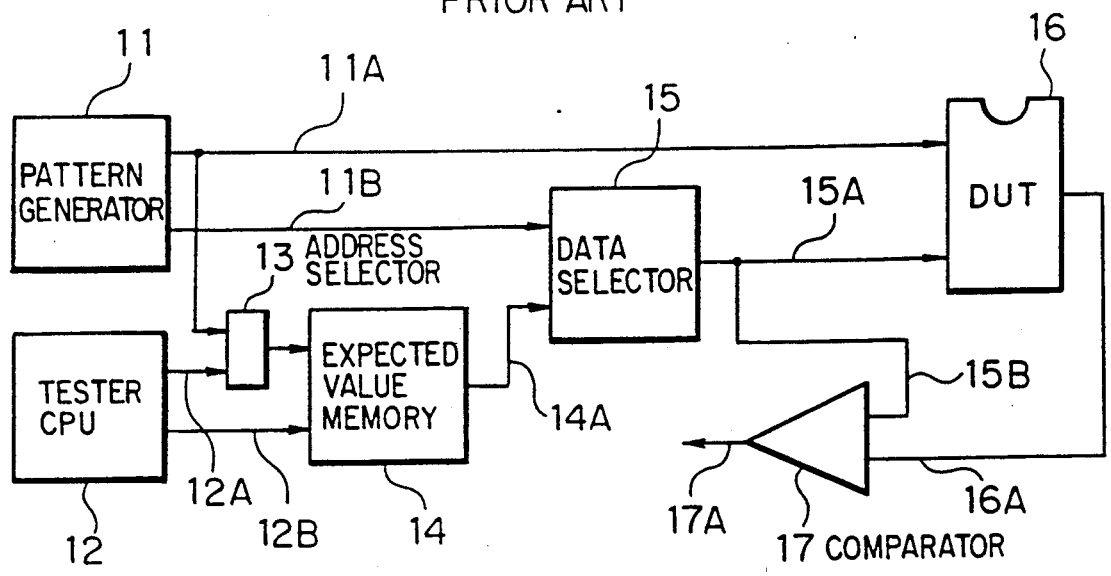

FIG. 7

| 1 | 0 | 1 | 0 |
|---|---|---|---|
| 0 | 1 | 0 | 1 |
| 1 | 0 | 1 | 0 |
| 0 | 1 | 0 | 1 |

A ⊕ B

=

| 1 | 0 | 1 | 0 |
|---|---|---|---|
| 1 | 0 | 1 | 0 |
| 1 | 0 | 1 | 0 |
| 1 | 0 | 1 | 0 |

DATA B

⊕ EXOR

| 0 | 1 | 0 | 1 |
|---|---|---|---|
| 0 | 1 | 0 | 1 |
| 0 | 1 | 0 | 1 |
| 0 | 1 | 0 | 1 |

DATA A

PATTERN GENERATING APPARATUS FOR MEMORY HAVING A LOGICAL OPERATION FUNCTION

TECHNICAL FIELD

The present invention relates to a test pattern generating apparatus for a memory having a logical operation function.

FIG. 5 illustrates a typical example of a memory having a logical calculating function. FIG. 5(a) shows a state where data A is written into a memory 21 to form a written memory 22. FIG. 5(b) shows data B written into the memory 22 to form a written memory 23. In the latter case, if the logical operation is AND, data B is written and a data of AB is read out from the memory 23.

The present invention relates to a generator for generating an expected data for testing such a memory as in FIG. 5.

PRIOR ART

A memory testing apparatus according to the conventional technique will be explained with reference to FIG. 6.

An address 11A generated by a pattern generator 11 is supplied to a memory 16 to be tested (hereinafter called "DUT") as well as to an expected value memory via an address selector 13.

The expected value memory 14 is mainly used for generating an expected data for testing a ROM (read only memory). The expected data is pre-written at a low speed into the expected value memory 14 from a tester CPU 12 as data 12B under the control of an address 12A supplied by way of an address selector 13, prior to the operation of the pattern generator 11.

Either the data 11B generated by the pattern generator or a memory data 14A from the expected value memory 14 is selected by a data selector 15 as a write data 15A and an expected data 15B.

The data selector 15 selects the data 11B when a RAM (random access memory) is to be tested and selects the memory data 14A when a ROM is to be tested.

A data 16A read out of a DUT 16 is compared with the expected data 15B in a comparator 17 which outputs a result representative of the judgement based on the comparison.

Next, a practical data pattern of the memory having a logical function will be explained by making reference to FIG. 7.

In order to generate a data pattern using the tester shown in FIG. 6, the pattern generator 11 generates a data A such as 01010101... as a write data 15A which is written into the DUT 16.

Next, a data B such as 0000111100001111 is generated and written into the DUT 16. During this writing, if the logical operation is EXOR (exclusive OR), a data resulting from the EXOR operation between the data A and B, that is, 0101101001011010 must be available.

PROBLEMS TO BE SOLVED BY THE PRESENT INVENTION

Usually, generation of data by a memory tester pattern generator is achieved mainly through repetition of data inverting and non-inverting functions and, accordingly the data A and B shown in FIG. 7 can be easily obtained.

On the other hand, it is not an easy task to generate an expected value data which is a result of a logical operation between the data A and B. More complicated data A and B than those shown in FIG. 7 will make it more difficult for the pattern generator to generate an expected value data.

Accordingly, another approach is to employ an expected value memory which is used for testing a ROM.

However, it is difficult for the conventional system to produce an expected data by the expected value memory if DUT is of a large capacity, because the expected data is complicated. Further, when expected data is written into the expected value memory from a tester CPU, it takes a time due to the slow writing and, accordingly, when multiple types of testings are used, time consuming several writings into the expected value memory become necessary.

Accordingly, a principal object of the present invention is to achieve high speed data writing into an expected value memory.

Another object of the invention is to make it possible to generate complicated expected data.

SUMMARY OF THE INVENTION

The present invention achieves the above and other objects by a pattern generating apparatus for a memory having a logical operation function, which comprises:

A pattern generator for generating address, data, ALU control and a write control;

a tester CPU for generating data bus and an address bus; an address selector which receives said address and said address bus;

a data selector which receives said data and said data bus;

an expected value memory which receives an output of said data selector, an output of said address selector and said write control from said pattern generator;

an ALU (arithmetic logic unit) which receives said data from said pattern generator and an output of said expected value memory and performs a logical operation under the control of said ALU control, the output being supplied as a write data to said memory unit to be tested; and a comparator which receives an output of said memory unit and compare said output of said memory unit with an expected data from said ALU, said memory unit being supplied with said address from the pattern generator and a write data from said ALU.

BRIEF EXPLANATION OF THE DRAWINGS

FIG. 6 is a diagram of a conventional memory test apparatus, and FIG. 7 is a practical data pattern of the memory having a logical operation function.

DETAILED EXPLANATION OF THE INVENTION

A preferred embodiment of the memory test pattern generating apparatus according to the present invention will now be described in detail by making reference to FIGS. 1 through 4.

Figure 1:
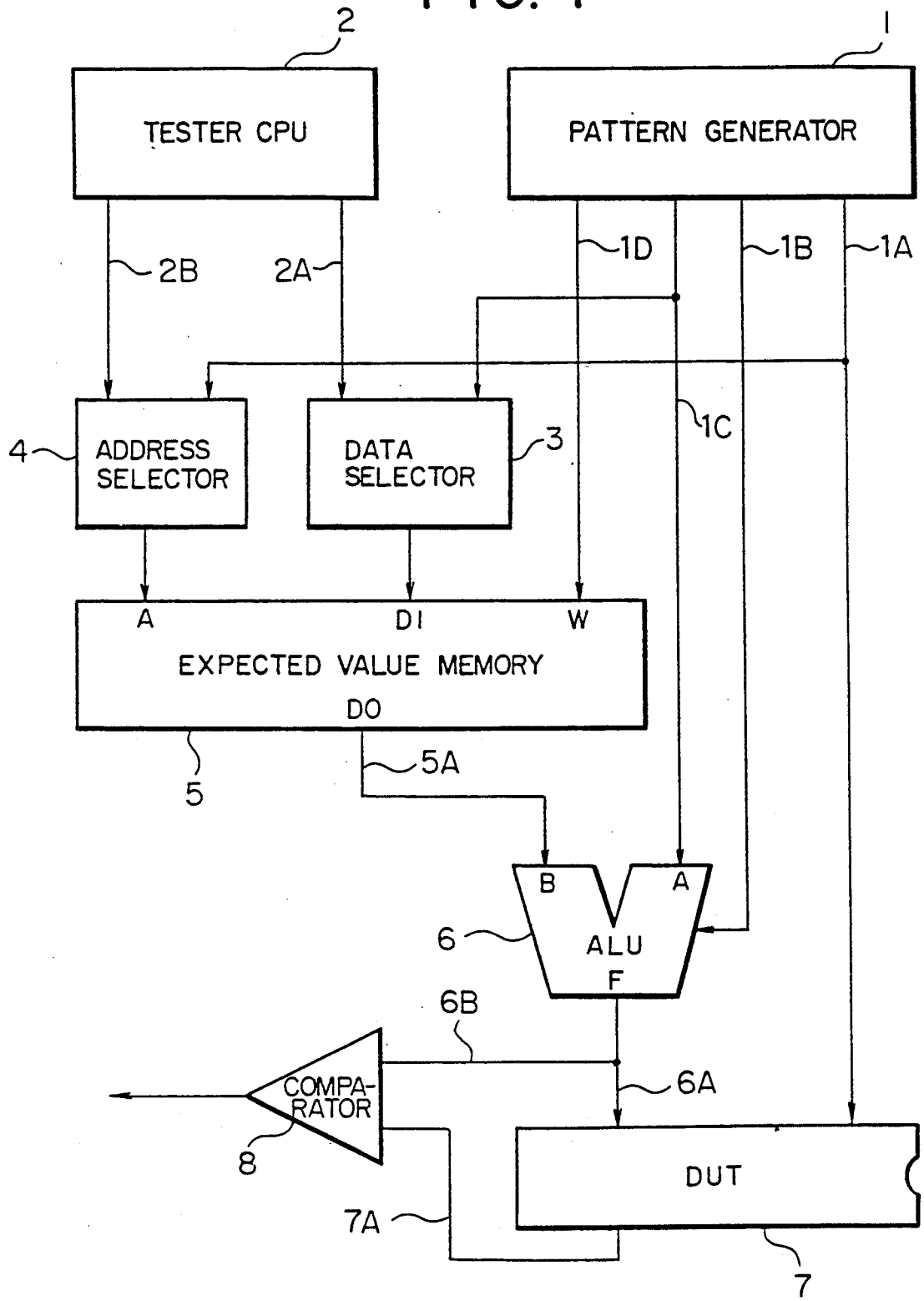
FIG. 1 illustrates a block diagram of a pattern generator for a memory having a logical operation function.

Referring to FIG. 1, the apparatus comprises a pattern generator 1 for generating address 1A, data 1C, ALU control 1B and a write control 1D at its output terminals, a tester CPU 2 for generating data (hereinafter called "data bus") 2A on a data bus and an address (hereinafter called "address bus") 2B on an address bus, an address selector 4 which receives the address 1A and the address bus 2B, and a data selector 3 which receives said data 1C and said data bus 2A. The selectors select the address 1A and data 1C or the address bus 2B and the data bus 2A depending of the type of the testing. The apparatus further includes an expected value memory 5 which receives an output of the data selector 3, an output of the address selector 4 and the write control 1D from the pattern generator 1, an ALU (arithmetic logic unit) 6 which receives the data from the pattern generator 1 and an output of the expected value memory 5 and performs a logical operation under the control of the ALU control 1B. The output of this unit 6 is supplied as a write data 6A to the memory unit (hereinafter called "DUT") 7 to be tested. The DUT receives address 1A and the write data 6A and memorizes the write data. An output of the DUT 7 is supplied to a comparator 8 which receives an output of the DUT 7 and compares it with an expected data 6B from the ALU.

The address 1A outputted from the pattern generator 1 is supplied to the DUT 7 to be tested and to the address selector 4 and the data 1C is supplied to the data selector 3.

The address bus 2B from the tester CPU 2 is supplied to the address selector 4 and the data bus 2A is supplied to the data selector 3.

The address selector 4 is adapted to select one of the address 1A and the address bus 2B so as to use it as an address of the expected value memory 5.

The data selector 3 is adapted to select one of the data 1C and the data bus 2A so as to use it as a data input to the expected value memory 5. The address selector 4 and the data selector 3 are interlocked so that a selected one of the pattern generator and tester CPU is connected to the expected value memory 5.

The memory data 5A outputted from the expected value memory 5 and the data 1C from the pattern generator 1 is subjected to logical operation in the ALU 6. The result of the logical operation is outputted as a write data 6A and an expected data 6B.

Further, the ALU control 1B from the pattern generator 1B selects the types of logical operation.

The write control 1D controls the writing operation of the expected value memory.

OPERATION

Figure 2:
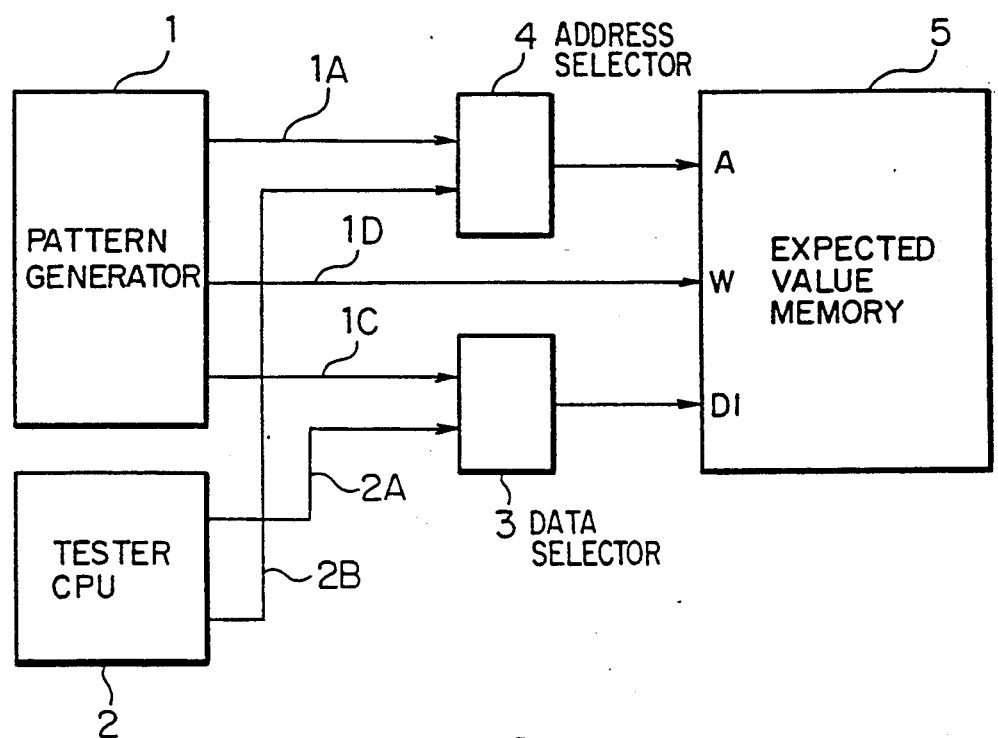
FIG. 2 is a high speed data write circuit for writing into an expected value memory.

FIG. 2 shows a high speed data write circuit for writing into the expected value memory, which is a part of the apparatus shown in FIG. 1.

In FIG. 2, the data selector 3 having a data input D1 to the expected pattern memory 5 is added, so that one of the data 1C from the pattern generator 1 and the data bus 2B can be selected.

Further, the write control 1D is supplied from the pattern generator 1 to the expected value memory 5.

Thus, in a ROM testing operation, the address selector 4 and the data selector 3 select the address bus 2A and the data bus 2B, respectively, and an expected data is written into the expected value memory 5 at a low speed.

On the other hand, in a high speed writing of data into the expected value memory 5 during the time when, for example, a memory having a logical operation function is being tested, the address selector 4 and the data selector 3 select the address signal 1A and the signal 1C from the pattern generator 1, respectively, and an expected data is written into the expected value memory 5 under the control of the write control signal 1B.

In such manner, the writing in speed into the expected value memory 5 is as fast as the speed of the pattern generations.

Figure 3:
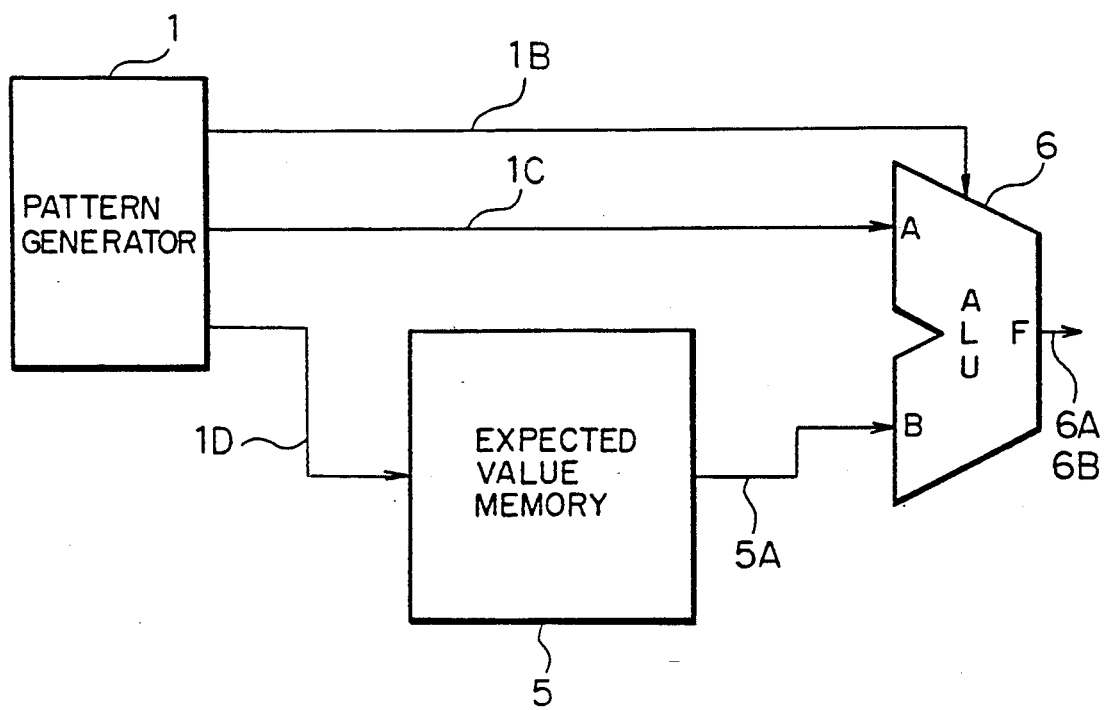
FIG. 3 is a data generating circuit which utilizes an ALU, FIG. 4A, B and C are an explanatory diagram for describing the operation of the system shown in FIG. 1, FIG. 5 A and B are an explanatory diagram for showing a memory having an logical operation function.

Next, FIG. 3 is a data generating circuit utilizing the ALU 6, which is a part of the apparatus shown in FIG. 1.

In FIG. 3, the ALU 6 is used in place of the data selector 15 in FIG. 6 which is adapted to select one of the data 11B from the pattern generator 11 and the memory data 14A from the memory data 14.

The logical operation of the ALU 6 of FIG. 3 is selected by the ALU control 1B from the pattern generator 1.

For a RAM testing, the data 1C from the pattern generator 1 is selected as a write data 6A and an expected data 6B, while for a ROM testing, the memory data 5A from the expected memory 5 is selected as an expected data 6B.

Further, for a testing of a memory having a logical operation function, the ALU 6 performs a logical operation between the data 1C and the memory data to produce an expected data 6B.

Using FIG. 4, the operation of the system shown in FIG. 1 will be explained.

As shown in FIG. 4(a), the pattern generator 1 generates data A, which is, in turn, is written into the DUT 7 as well as into the expected value memory 5. If the logical operation mode of the DOT 7 is normal, the data A is written in as it is.

Then, as shown FIG. 4(b), the pattern generator 1 generates data B, which, in turn, is written into the DUT 7. If the logical operation mode of the DUT 7 is exclusive OR, data A+B is written in.

Next, as shown in FIG. 4(c), reading of the DUT 7 outputs the data A & B as a read data 7A. The data A is generated from the pattern generator 1 and the data B is read out of the expected value memory A and are subjected to a logical operation A+B in the ALU 6 to obtain as a result an expected data 6B. The expected data 6B and the read data 7A are compared in the comparator 8.

ADVANTAGES OF THE INVENTION

According to the present invention, a data selector is added to the conventional memory test apparatus and an ALU (arithmetic logical operation unit) is adopted to obtain a logical operation, thus, it is easy to generate an expected data for a memory having a logical operation function. Moreover, it is possible to reduce the time required for writing data into the expected value memory, whereby the testing time is shortened.

What is claimed is:

1. A pattern generating apparatus for memory having a logical operation function, which comprises:

A pattern generator for generating an address, a data, an ALU control and a write control;

a tester CPU for generating a data bus and an address bus; an address selector which receives said address and said address bus;

a data selector which receives said data and said data bus;

an expected value memory which receives an output of said data selector, an output of said address selector and said write control from said pattern generator;

an ALU (arithmetic logic unit) which receives said data from said pattern generator and an output of said expected value memory and performs a logical operation under the control of said ALU control, the output being supplied as a write data to said memory unit to be tested; and a comparator which receives an output of said memory unit and compare said output of said memory unit with an expected data from said ALU, said memory unit being supplied with said address from the pattern generator and a write data from said ALU.

* * * * *